United States Patent
Kawase

(10) Patent No.: US 6,642,705 B2
(45) Date of Patent: Nov. 4, 2003

(54) ELECTRIC CURRENT SENSOR

(75) Inventor: Masahiro Kawase, Saitama (JP)

(73) Assignee: Canon Denshi Kabushiki Kaisha, Tokyo (JP)

( * ) Notice: Subject to any disclaimer, the term of this patent is extended or adjusted under 35 U.S.C. 154(b) by 43 days.

(21) Appl. No.: 09/978,864

(22) Filed: Oct. 18, 2001

(65) Prior Publication Data

US 2002/0047701 A1 Apr. 25, 2002

(30) Foreign Application Priority Data

Oct. 19, 2000 (JP) .................................. 2000-318776

(51) Int. Cl.[7] .............................................. G01R 33/02
(52) U.S. Cl. ............................. 324/117 R; 324/117 H; 324/249
(58) Field of Search ..................... 324/249, 117 R, 324/117 H, 763, 235

(56) References Cited

U.S. PATENT DOCUMENTS

| | | | |
|---|---|---|---|
| 5,041,780 A | 8/1991 | Rippel | 324/117 H |
| 5,570,034 A | 10/1996 | Needham et al. | 324/763 |
| 5,764,055 A | 6/1998 | Kawase | 324/249 |
| 5,889,403 A | 3/1999 | Kawase | 324/249 |
| 6,310,475 B1 * | 10/2001 | Kawase et al. | 324/235 |

FOREIGN PATENT DOCUMENTS

| | | |
|---|---|---|
| CH | 358 157 A | 11/1961 |
| DE | 298 19 486 U1 | 3/2000 |
| EP | 0 947 843 A2 | 10/1999 |
| JP | 8-330644 | 12/1996 |
| JP | 9-127218 | 5/1997 |

OTHER PUBLICATIONS

"Neues Messverfahren fur Echtzeitstromsensoren und die Anwendung in der Pruftechnik," Kolb, Messen Prufen Automatisieren, Internationales Fachjournal, Hans Holzmann, Verlag., Bad Worishofen, DE, No. 12, Dec. 1989, pp. 600–611.

* cited by examiner

Primary Examiner—N. Le
Assistant Examiner—Vincent Q. Nguyen
(74) Attorney, Agent, or Firm—Fitzpatrick, Cella, Harper & Scinto

(57) ABSTRACT

An electric current sensor which includes a pair of magnetic detectors arranged near a signal line, flowing through which is an electric current to be detected. Additionally, a differential amplifier is included for differentially amplifying two signals obtained by the paired magnetic detectors, detecting a magnetic field from the electric current flowing through the signal line, and outputting a detection signal for the detected electric current. The paired magnetic detectors are arranged adjacent to each other along a first straight line and sandwiching between them a second straight line. The first straight line is perpendicular to but spaced from the signal line, and the second straight line crosses perpendicularly to both the first straight line and the signal line. The paired magnetic detectors have the same magnetic field detecting direction, which may be parallel or inclined relative to the second straight line.

8 Claims, 5 Drawing Sheets

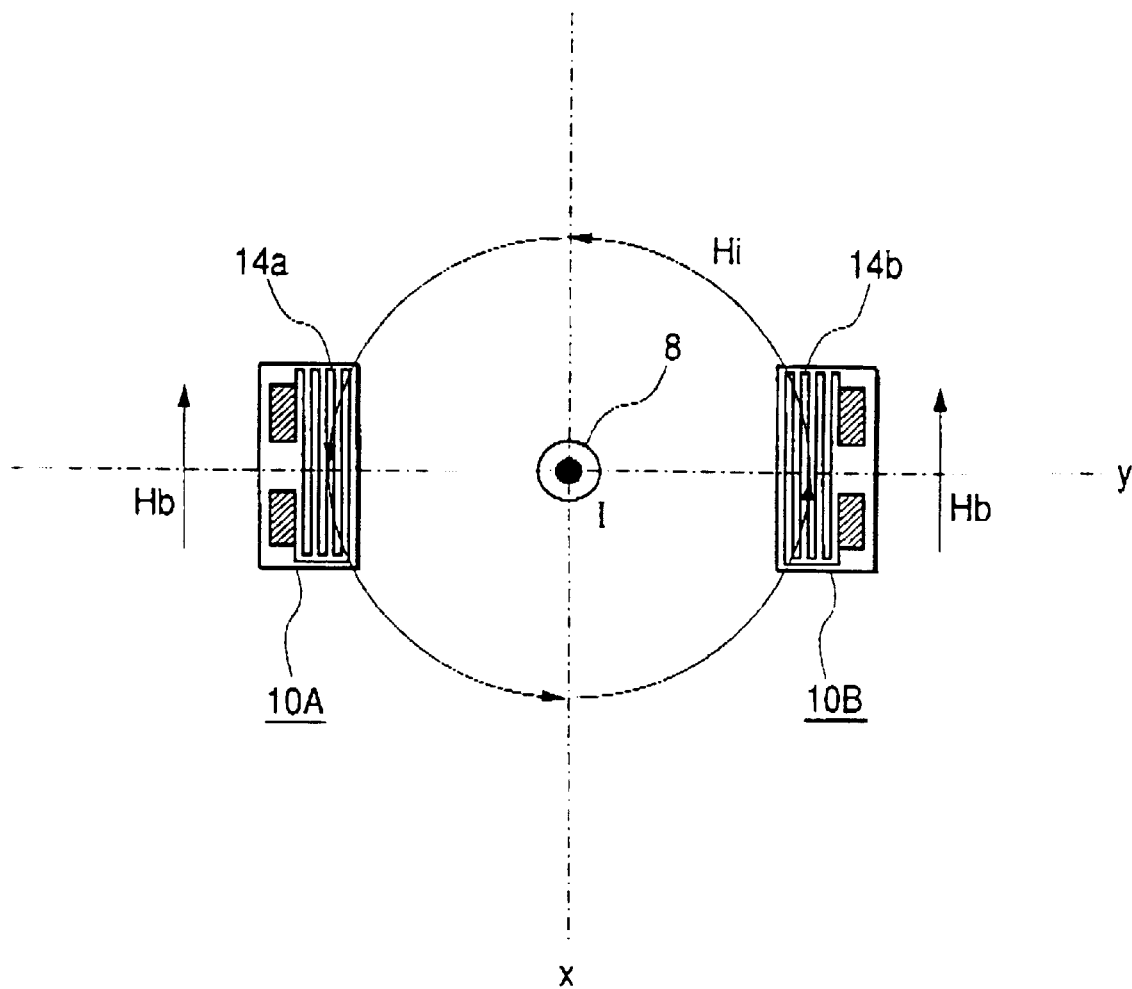

ELECTRIC CURRENT SENSOR

BACKGROUND OF THE INVENTION

1. Field of the Invention

This invention relates to an electric current sensor for detecting the electric current flowing through a signal line by detecting the magnetic field from the electric current by means of a magnetic detector.

2. Related Background Art

Conventionally, a current transformer, a Hall-effect device or an MR (magnetoresistive effect) device is used for an electric current sensor. As a result of the ever-increasing demand for power-saving equipment, the market for electric current sensors has been expanding remarkably in recent years. Particularly, the demand for high precision electric current sensors that can monitor delicate changes in the electric current is high. However, the sensitivity of conventional electric current sensors is limited and the advent of novel and highly sensitive electric current sensors is expected.

The idea of using a magnetic impedance device (to be referred to as MI device hereinafter) as the magnetic detector of an electric current sensor for detecting the electric current flowing through a signal line by detecting the magnetic field from the electric current is known. When a high frequency electric current is applied to the magnetic detector made of a magnetic material of an MI device, the impedance between the opposite ends of the magnetic detector changes as a function of the external magnetic field and the change in the impedance is taken out as signal.

Particularly, an MI device having a magnetic detector formed by folding an oblong and straight magnetic thin film for a plurality of times as disclosed in Japanese Patent Application Laid-open No. 8-330644 or No. 9-127218, which are filed by the applicant of the present patent application, and described hereinafter by referring to FIG. 8 of the accompanying drawings, provides an advantage that it is as small as a resistor chip but more than hundred times sensitive than an MR device.

Such a highly sensitive MI device is arranged near a signal line through which the electric current to be observed flows so that the device detects the electric current by detecting the magnetic field generated by the electric current. However, it is normally difficult to measure the electric current with a high S/N ratio, eliminating the influence of any external turbulent magnetism, by means of a single MT device.

The use of a pair of MI devices that are differentially operated is known. FIG. 8 of the accompanying drawings schematically illustrates a known arrangement of a pair of MI devices. Referring to FIG. 8, there are shown a signal line 8 through which the electric current to be observed flows and a pair of MI devices 10A, 10E comprising respectively non-magnetic substrates 12a, 12b and magnetic detectors 14a, 14b arranged on the respective non-magnetic substrates 12a, 12b. Each of the magnetic detectors 14a, 14b is formed by folding an oblong and straight magnetic thin film for a plurality of times. The magnetic detectors 14a, 14b are adapted to detect a magnetic field in the longitudinal direction of the folded pattern of the magnetic thin films.

In FIG. 8, a three axes system is used for the convenience of explanation of the MI devices. The central axis of the signal line 8 is denoted by z-axis, whereas the x-axis runs perpendicularly relative to the z-axis while the y-axis runs perpendicularly relative to both the z-axis and the x-axis. The MI devices 10A. 10B are arranged near the signal line 8 at diametrically disposed respective positions on a circle centered at the central axis of the signal line 8. The MI devices are adapted to detect a magnetic field in the respective longitudinal directions that are running in parallel with each other and agree with respective tangential directions of the circle on the xy-plane defined by the x- and y-axes.

When detecting the electric current, a bias magnetic field Hb is applied to the MI devices 10A, 10B in a direction running along the x-axis. Thus, the magnetic field Hi generated by the electric current I of the signal line 8 shows opposite phases relative to the MI devices 10A, 10B, whereas all external magnetic fields are in phase relative to the latter. Therefore, all external magnetic fields other than the magnetic field Hi are offset by differentially operating the MI devices 10A, 10B to make it possible to detect the electric current with a high S/N ratio.

However, there is a strong demand for electric current sensors of this type showing an improved sensitivity for electric currents. Therefore, it is the object of the present invention to provide an electric current sensor with an improved sensitivity that is down-sized and highly resistive against external turbulent magnetic fields and shows a high S/N ratio.

SUMMARY OF THE INVENTION

According to the invention, the above object is achieved by providing an electric current sensor comprising:

a pair of magnetic detectors arranged near a signal line flowing an electric current to be detected; and a differential amplifier for differentially amplifying two signals obtained by said paired magnetic detectors detecting a magnetic field from the electric current flowing through said signal line and outputting a detection signal for said detected electric current;

wherein said paired magnetic detectors are arranged adjacent to each other in a direction along the y-axis as sandwiching the x-axis with the magnetic field detecting direction running along the x-axis, the central axis of said signal line being defined as z-axis, the x-axis being perpendicular relative to the z-axis, the y-axis being perpendicular relative to both the z-axis and the x-axis.

In another aspect of the invention, there is provided an electric current sensor comprising:

a pair of magnetic detectors arranged near a signal line flowing an electric current to be detected; and a differential amplifier for differentially amplifying two signals obtained by said paired magnetic detectors detecting a magnetic field from the electric current flowing through said signal line and outputting a detection signal for said detected electric current;

wherein said paired magnetic detectors are arranged adjacent to each other in a direction along the y-axis as sandwiching the x-axis with the magnetic field detecting direction running in a direction inclined relative to the x-axis in a plane parallel to the xz-plane defined by said x-axis and said z-axis, the central axis of said signal line being defined as z-axis, the x-axis being perpendicular relative to the z-axis, the y-axis being perpendicular relative to both the z-axis and the x-axis.

BRIEF DESCRIPTION OF THE DRAWINGS

FIG. 9 is a schematic view of the two MI devices of the electric current sensor of FIG. 8 as viewed in the direction of the z-axis.

DESCRIPTION OF THE PREFERRED EMBODIMENTS

Now, the present invention will be described in greater detail by referring to the accompanying drawings that illustrate preferred embodiments of the invention. The embodiments described below comprise a pair of MI devices adapted to detect the magnetic field generated by the electric current flowing through a signal line.

First Embodiment

Figure 1:
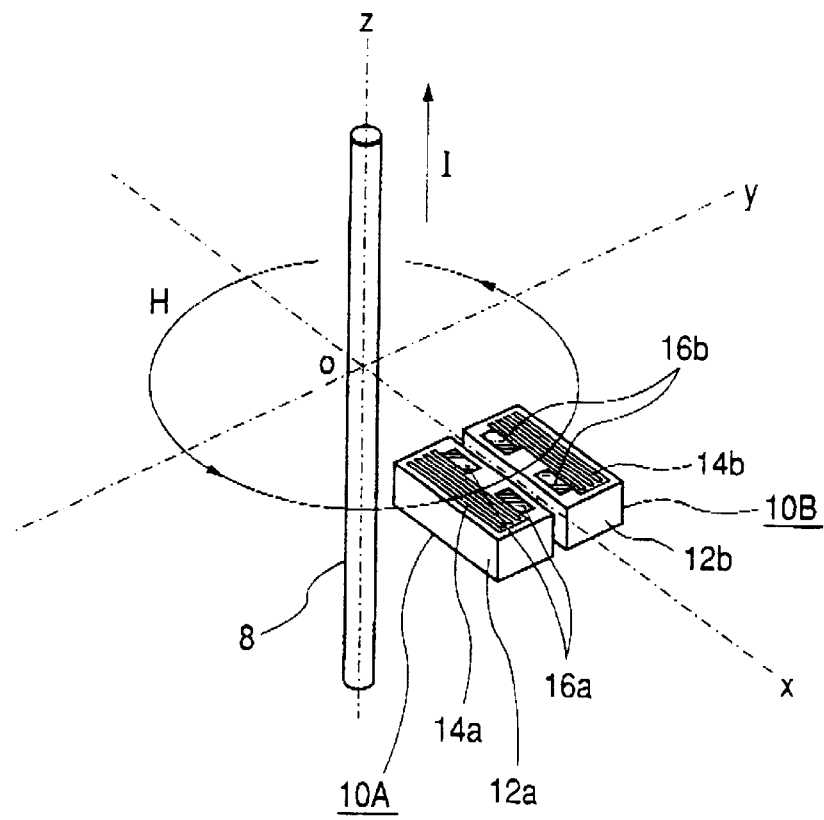
FIG. 1 is a schematic perspective view of the first embodiment of electric current sensor according to the invention, showing the positional arrangement of the two MI devices along with the electric current and the magnetic field generated by the electric current to be detected by the MI devices.

The first embodiment of the invention will be described by referring to FIGS. 1 through 6. FIG. 1 is a schematic perspective view of the first embodiment of electric current sensor according to the invention, showing the positional arrangement of the two MI devices of the embodiment. For the purpose of convenience of explanation, an orthogonal x-, y- and z-coordinate system is used in the following description. The central is of the signal line 8 is defined as z-axis, whereas the x-axis is perpendicular relative to the z-axis and crosses the latter at point o and the y-axis is perpendicular relative to both the z-axis and the x-axis and cross the x- and z-axes also at point o. Assume that the signal line 8 Is straight at least in a part thereof located close to the MI devices 10A, 10B.

The MI devices 10A, 10B respectively comprise non-magnetic substrates 12a, 12b and magnetic detectors 14a, 14b formed by a magnetic thin film showing a high magnetic permeability. More specifically, the magnetic detectors 14a, 14b are formed by folding a straight and oblong thin film for a number of times to produce parallel leaves and provided at the opposite ends thereof with respective terminal sections 16a, 16b. The magnetic detectors 14a, 14b are adapted to detect a magnetic field in the longitudinal direction of the folded pattern. Such an MI device formed by using a thin film provides an advantage of detecting the magnetic field component of a given direction because it shows a strong directivity in the longitudinal direction.

The MI devices 10A, 10B are arranged adjacent to each other in the direction along the y-axis as sandwiching the x-axis with the magnetic field detecting direction of the magnetic detectors 14a, 14b running along the x-axis.

Figure 2:
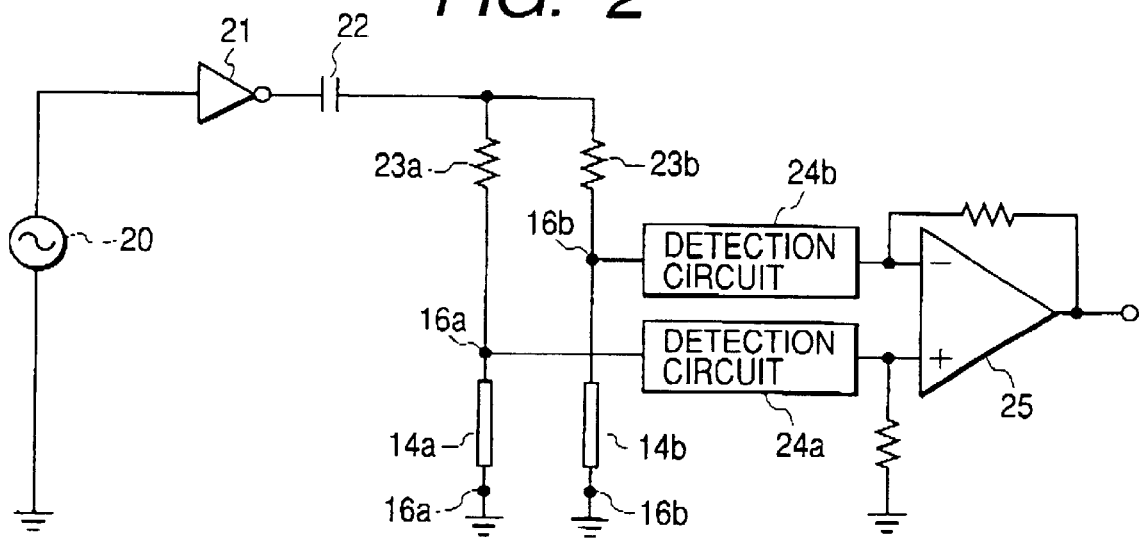
FIG. 2 is a schematic block diagram of the embodiment of electric current sensor of FIG. 1, showing its circuit configuration.

FIG. 2 is a schematic block diagram of the embodiment of electric current sensor of FIG. 1, showing its circuit configuration. Referring to FIG. 2, when the embodiment is used for detecting an electric current, a high frequency electric current in the MHz band is applied to the magnetic detectors 14a, 14b of the MI devices 10A, 10B from a high frequency oscillator 20 by way of a buffer amplifier 21, a DC-cutting capacitor 22 and respective impedance regulating resistors 23a, 23b. Then, the impedance between the opposite ends of the magnetic detectors 14a, 14b changes as a function of the external magnetic field including the magnetic field H from the electric current I flowing through the signal line 8 so that the amplitude of the high frequency electric current applied to the magnetic detectors 14a, 14b are modulated to change the amplitude voltage of the high frequency electric current between the opposite ends of the terminal sections 16a, 16b of the magnetic detectors 14a, 14b. The change in the amplitude voltage of each of the magnetic detectors 14a, 14b Is taken out as signal by the detection circuit 24a or 24b connected to the terminal sections 16a or 16b, whichever appropriate. The taken out two signals are then differentially amplified by the differential amplifier 25 and the output signal of the latter is produced as electric current detection signal.

Figure 3:
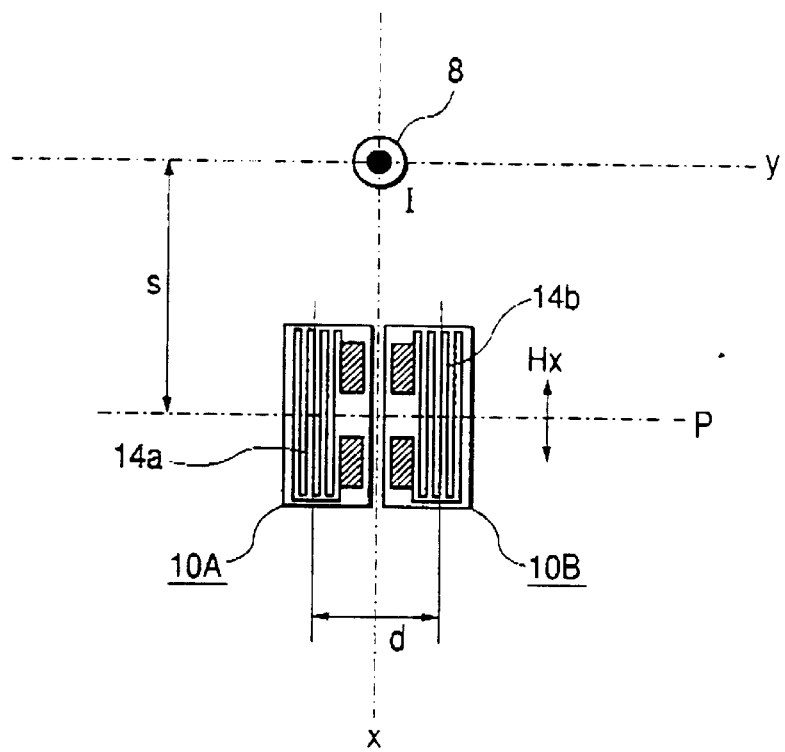
FIG. 3 is a schematic illustration of the two MI devices of the embodiment of electric current sensor of FIG. 1 as viewed in the direction of the z-axis.

FIG. 3 is a schematic illustration of the two MI devices 10A, 10B of the embodiment of electric current sensor of FIG. 1 as viewed in the direction of the z-axis. The distance between the central axes of the magnetic detectors 14a, 14b of the MI devices 10A, 10B in the direction of the y-axis is expressed by d. The distance between the central axis of the magnetic detector 14a in the direction of the x-axis and the y-axis is equal to the distance between the central axis of the magnetic detector 14b in the same direction and the y-axis and expressed by s.

Since the magnetic detectors 14a, 14b are adapted to detect the magnetic field in the direction of the x-axis, the component Hx in the direction of the x-axis of the magnetic field H generated by the electric current I of the signal line 8 will be detected by them. The magnetic field component Hx in the direction of the x-axis on the central axis p of the magnetic detectors 14a, 14b is expressed by formula (1) below.

$$Hx = Y/2\pi(Y^2 + S^2) \qquad (1)$$

Figure 4:
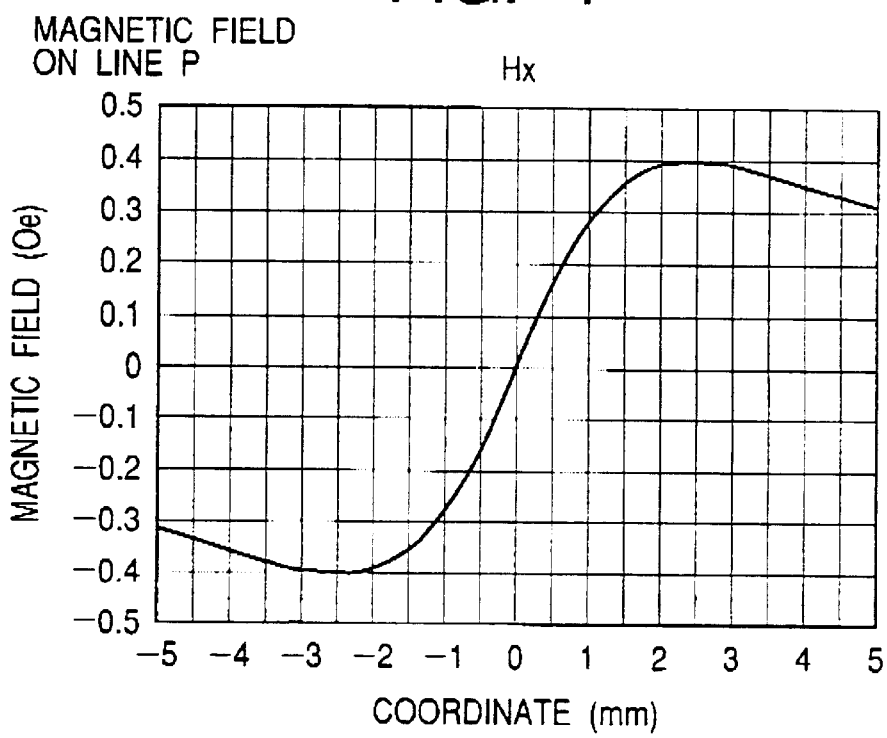
FIG. 4 is a graph illustrating the distribution of the magnetic field component Hx in the direction of the x-axis on the line p in FIG. 3 observed as a function of the distance from the x-axis.

FIG. 4 is a graph illustrating the distribution of the magnetic field component Hx in the direction of the x-axis on the line p in FIG. 3 observed as a function of the distance from the x-axis. Note that the graph shows the distribution of the magnetic field component Hx as a function of the distance from the x-axis as observed on a line running along the y-axis with s=2.5 mm. The magnetic field component Hx is directed oppositely at the opposite sides of the x-axis with the maximum and minimum values of 0.4 Oe observed at a point separated from the x-axis by 2.5 mm in the direction of the y-axis at either of the positive side and the negative side. Note that the polarity of the magnetic field directed toward the signal line 8 is positive.

The magnetic field component Hx in the direction of the x-axis of the magnetic field H generated by the electric current I of the signal line 8 is added with the opposite phases when the magnetic detectors 14a, 14b are operated in a differentiated manner because the magnetic detectors 14a, 14b of MI devices 10A, 10B are arranged adjacent to each other in the direction of the y-axis as sandwiching the x-axis with the magnetic field detecting direction running along the x-axis, but all the other external magnetic fields are eliminated because they are in phase relative to each other. Therefore, a good S/N ratio can be obtained. Additionally, since the magnetic field component Hx in the direction of the x-axis of the magnetic field H generated by the electric current I is weak relative to the overall magnetic field XL, the highly sensitive MI devices 10A, 10B can be operated properly when they are arranged close to the signal line 8.

In order for the electric current sensor to show a linear magnetic field detection performance, the magnetic detectors 14a, 14b are preferably arranged symmetrically relative to the x-axis and located at respective positions that are separated along the y-axis from the x-axis by a same distance.

Additionally, when the magnetic field from the electric current I of the signal line 8 is small and a maximum level needs to be secured for the electric current, the distance d between the central axes of the magnetic detectors 14a, 14b of the MI devices 10A, 105 in the direction of the y-axis should be made as twice large as the distance s between the central axis p in the direction of the x-axis of the magnetic detectors 14a, 14b and the y-axis.

If the electric current I is large and hence the magnetic field generated by it is also large, the magnetic field to be detected can be regulated by reducing the gap d. Differently stated, the gap d needs to be made less than twice of the distance s. With the above described conventional sensor comprising a pair of MI devices 10A, 10B arranged at diametrically disposed respective positions relative to the signal line 8, the strength of the magnetic field can be reduced only by increasing the distance between the MI devices 10A, 10E and the signal line 8. To the contrary, with this embodiment, the strength of the magnetic field can be reduced to some extent not only by increasing the distance s but also by reducing the gap d separating the MI devices 10A, 10B. This means that it is no longer necessary to enlarge excessively the space for accommodating the MI devices 10A, 10B because the MI devices can be accommodated in a relatively small space even if the electric current I of the signal line 8 is large and generates a strong magnetic field.

Figure 5:
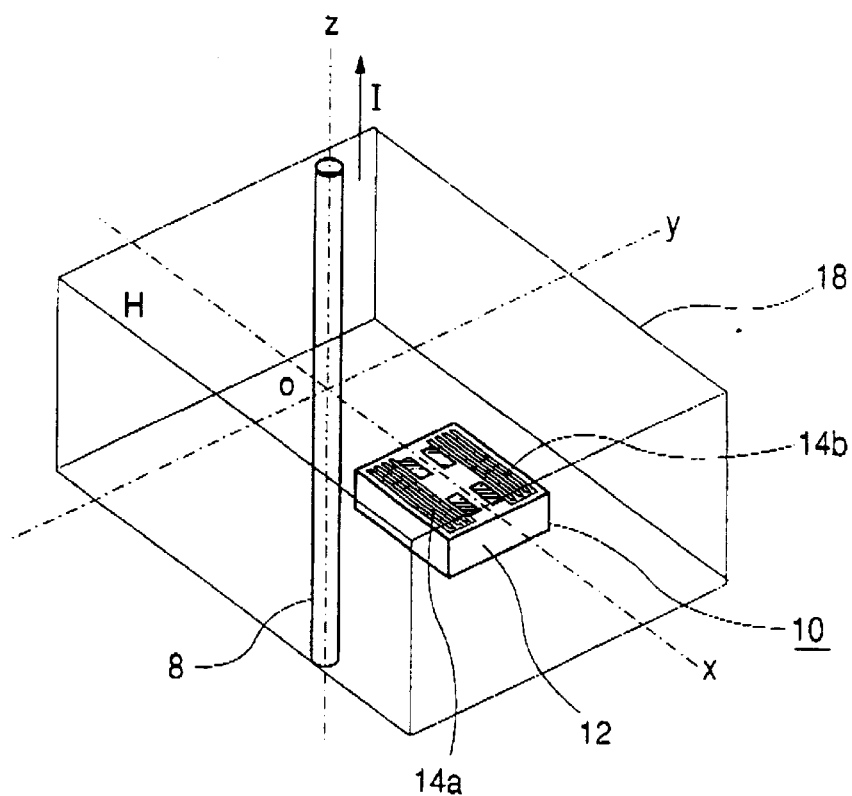
FIG. 5 is a schematic perspective view of the shield member that can be arranged in the embodiment of electric current sensor of FIG. 1.

When there is another signal line and/or a noise source such as a transformer located adjacent to the signal line 8, a good S/N ratio can be secured by providing a shield member 18 of a magnetic material such as Permalloy or amorphous ferrite to surround the signal line 8 and the MI device 10 as shown in FIG. 5 and fend off the magnetic field coming from them.

Note that the MI device 10 of FIG. 5 is realized by arranging a pair of magnetic detectors 14a, 14b of folded magnetic film very close to each other on a single non-magnetic substrate 12. In other words, it is realized by unitizing a pair of MI devices. While this arrangement does not allow to regulate the gap d between the magnetic detectors 14a, 14b, the sensor is made to show a simplified configuration and the MI device can be handled with ease.

Figure 6:
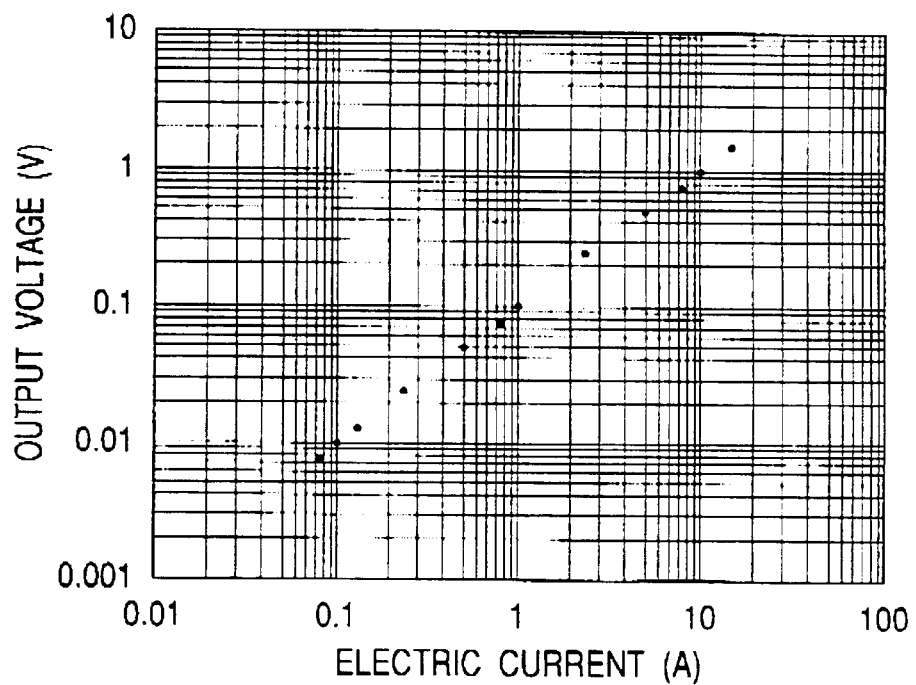
FIG. 6 is a graph produced by using the detection data obtained in an experiment using the embodiment of electric current sensor of FIG. 1 for actually detecting the electric current.

In order to verify the effect of this embodiment of electric current sensor, it was used to actually detect an electric current. FIG. 6 is a graph produced by using the detection data obtained in an experiment using this embodiment of electric current sensor for actually detecting the electric current.

In the experiment, the MI devices 10A, 10B were prepared by forming 1.4 mm long magnetic detectors 14a, 14b on respective non-magnetic substrates 12a, 12b formed of glass, each magnetic detector being formed of a folded Fe—Ta—C type magnetic thin film. Then, a permanent magnet was arranged near the MI devices 10A, 10B so as to evenly apply a bias magnetic field Hb of 8 Oe to the MI devices 10A, 10B along the x-axis, or the direction of magnetic field detection, in order to know the detection sensitivity. A pure copper rod with a diameter of 1 mm was used for the signal line 8 and an electric current was made to flow with a variable intensity between 0.1 and 10A, while the magnetic detectors 14a, 14b were separated from each other by a gap d of 2 mm and from the signal line 8 by a distance B of 2.5 mm. A high frequency current of 20 MHz obtained from a high frequency oscillator 20 in the electric circuit of the electric current sensor was applied to the magnetic detectors 14a, 14b of the MI devices 10A, 10B. The amplification gain of the differential amplifier 25 was so regulated that a change of 0.1V might be obtained with a DC of 1A.

As a result of the above experiment, the embodiment was proved to show a highly linear electric current detection performance between 0.1 and 10A as shown FIG. 6. The embodiment having the above described non-contact configuration can be made adaptable to about 10 mA by reducing the gap d and the distance s.

Second Embodiment

Figure 7:
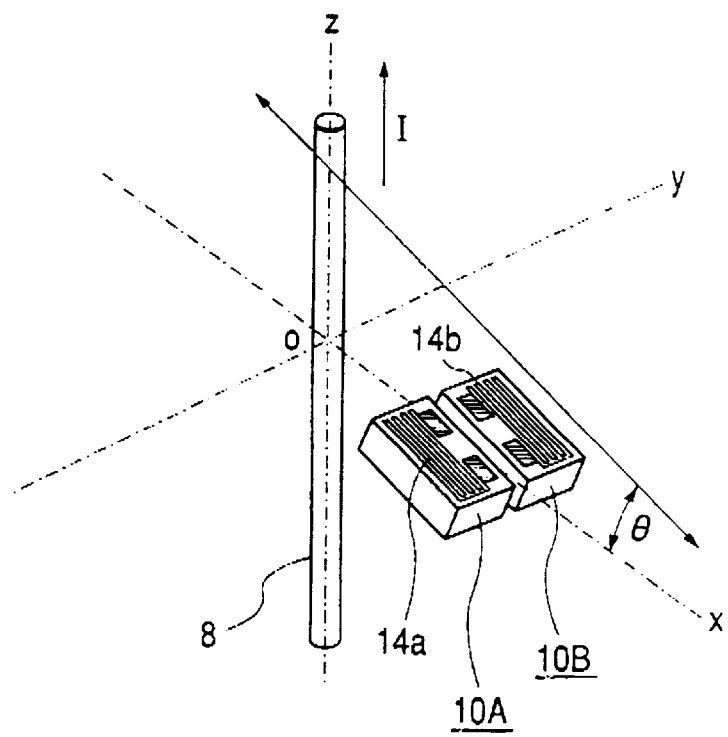
FIG. 7 is a schematic perspective view of the second embodiment of electric current sensor according to the invention, showing the positional arrangement of the two MI devices.
Figure 8:
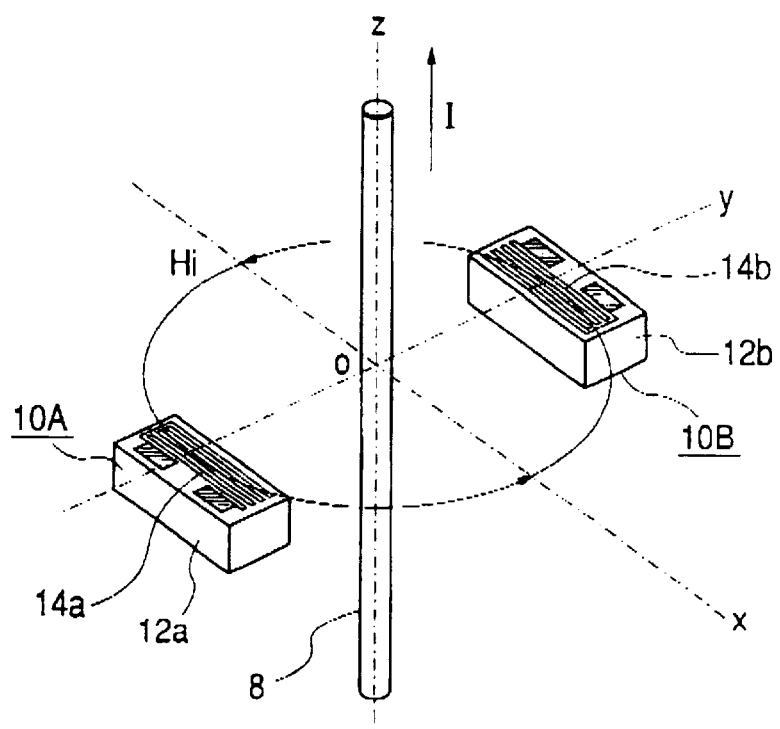
FIG. 8 is a schematic perspective view of a conventional electric current sensor, showing the positional arrangement of the two MI devices along with the magnetic field generated by the electric current to be detected by the MI devices.

While an MI device is highly sensitive, it requires delicate positionally regulating operations when the electric current I of the signal line 8 is large because the magnetic field detection range is reduced as small as several oersteds. While the magnetic field detection range can be lowered by increasing the distance s described earlier by referring to FIG. 2, a similar effect can be obtained by arranging the MI devices 10A, 10B in a manner as illustrated in FIG. 7 for the second embodiment of the invention. The second embodiment is similar to the first embodiment in that the MI devices 10A, 10B are arranged adjacent to each other in the direction of the y-axis as sandwiching the x-axis in an area located close to the signal line 8. However, it differs from the first embodiment in that the magnetic field detecting direction of the MI devices 10A, 10B, or the longitudinal direction of the pattern of the magnetic field detectors 14a, 14b, is inclined from the direction of the x-axis by an angle of θ in a plane parallel to the xz-plane defined by the x-axis and the z-axis as indicated by arrows in FIG. 7. While the magnetic field detecting direction is inclined relative to the x-axis toward the positive direction of the z-axis in FIG. 7, it may alternatively be inclined toward the negative direction of the z-axis. Otherwise, the second embodiment is identical with the first embodiment.

With the arrangement of the MI devices 10A, 10B of the second embodiment, it is possible to lower the magnetic field detection range of the embodiment to accommodate a large electric current, while maintaining the dimensions of the MI devices 10A, 10B. More specifically, since an MI device shows a strong uni-axial magnetic anisotropy in the longitudinal direction of the magnetic detector thereof, it is possible to regulate the sensitivity, utilizing attenuation of magnetic field corresponding to cos θ on the basis of the component vector, when the longitudinal direction of the magnetic field detector is inclined by angle θ relative to the x-axis.

While MI devices are used as magnetic detectors in the above described embodiments, they may be replaced by MR devices or some other devices that are arranged in a manner as described above for the embodiments.

What is claimed is:

1. An electric current sensor comprising:

a pair of magnetic detectors arranged near a signal line flowing an electric current to be detected; and a differential amplifier for differentially amplifying two signals obtained by said paired magnetic detectors detecting a magnetic field from the electric current flowing through said signal line and outputting a detection signal for said detected electric current;

wherein said paired magnetic detectors are arranged adjacent to each other in a direction of the y-axis as sandwiching the x-axis with the magnetic field detecting direction running along the x-axis, the central axis of said signal line being defined as z-axis, the x-axis being perpendicular relative to the z-axis, the y-axis being perpendicular relative to both the z-axis and the x-axis.

2. An electric current sensor comprising:

a pair of magnetic detectors arranged near a signal line flowing an electric current to be detected; and a differential amplifier for differentially amplifying two signals obtained by said paired magnetic detectors detecting a magnetic field from the electric current flowing through said signal line and outputting a detection signal for said detected electric current;

wherein said paired magnetic detectors are arranged adjacent to each other in a direction of the y-axis as sandwiching the x-axis with the magnetic field detecting direction running in a direction inclined relative to the x-axis in a plane parallel to the xz-plane defined by said x-axis and said z-axis, the central axis of said signal line being defined as z-axis, the x-axis being perpendicular relative to the z-axis, the y-axis being perpendicular relative to both the z-axis and the x-axis.

3. An electric current sensor according to claim 1 or 2, further comprising:

a shield member made of a magnetic material for surrounding and magnetically shielding said signal line and said pair of magnetic detectors.

4. An electric current sensor according to claim 1 or 2, wherein said pair of magnetic detectors are arranged in such a way that the gap d separating the respective centers of their magnetic detecting sections in the direction of the y-axis is less than twice of the distance s between their respective centers of the magnetic detecting sections in the direction of the x-axis and the y-axis.

5. An electric current sensor according to claim 1 or 2, wherein said pair of magnetic detectors are arranged in such a way that the respective magnetic detecting sections are separated from the x-axis by a same distance in the direction of the y-axis.

6. An electric current sensor according to claim 1 or 2, wherein said magnetic detectors are magnetic impedance devices.

7. An electric current sensor according to claim 6, wherein said magnetic impedance devices have respective magnetic detecting sections formed by folding a straight and oblong thin film for a number of times to produce parallel leaves.

8. An electric current sensor according to claim 6, wherein said magnetic impedance devices are formed by arranging their respective magnetic detecting sections prepared by folding an oblong thin film on a single non-magnetic substrate and unifying them into a single magnetic impedance device.

* * * * *

UNITED STATES PATENT AND TRADEMARK OFFICE
CERTIFICATE OF CORRECTION

PATENT NO.    : 6,642,705 B2
DATED         : November 4, 2003
INVENTOR(S)   : Kawase It is certified that error appears in the above-identified patent and that said Letters Patent is hereby corrected as shown below:

Column 1,
Line 48, "single MT" should read -- single MI --; and
Line 55, "10E" should read -- 10B --.

Column 2,
Line 2, "10A." should read -- 10A, --.

Column 3,
Line 52, "is" should read -- axis --.

Column 5,
Line 11, "field XL," should read -- field H, --;
Line 24, "105 in" should read -- 10B in --; and
Line 37, "10E and" should read -- 10B and --.

Column 6,
Line 14, "distance B" should read -- distance s --.

Signed and Sealed this

Fourth Day of January, 2005

JON W. DUDAS
*Director of the United States Patent and Trademark Office*